United States Patent
Fisher et al.

(10) Patent No.: US 11,022,374 B2
(45) Date of Patent: Jun. 1, 2021

(54) STAGED SPRAY INDIRECT EVAPORATIVE COOLING SYSTEM

(71) Applicant: Munters Corporation, Selma, TX (US)

(72) Inventors: Mark Fisher, Centerville, VA (US);
Bryan Keith Dunnavant, Lexington, VA (US); Michael Boucher, Lexington, VA (US)

(73) Assignee: Munters Corporation, Selma, TX (US)

( * ) Notice: Subject to any disclaimer, the term of this patent is extended or adjusted under 35 U.S.C. 154(b) by 157 days.

(21) Appl. No.: 16/127,325

(22) Filed: Sep. 11, 2018

(65) Prior Publication Data
US 2020/0080787 A1    Mar. 12, 2020

(51) Int. Cl.
| F28D 5/02 | (2006.01) |
| F28F 21/06 | (2006.01) |
| H05K 7/20 | (2006.01) |

(52) U.S. Cl.
CPC ............... *F28D 5/02* (2013.01); *F28F 21/06* (2013.01); *H05K 7/208* (2013.01); *H05K 7/20745* (2013.01); *F28F 2265/14* (2013.01)

(58) Field of Classification Search
CPC .... F28F 2210/02; F28F 2210/04; F28F 27/02; F28F 27/003; F28F 25/06; F28F 25/02; F28F 25/12; F28F 2265/14; F28F 21/06; F28D 17/04; F28D 7/0091; F28D 7/0075; F28D 3/04; F28D 5/02; F28D 3/02; F28C 1/00; F28C 2001/006; F28C 1/14; F24F 5/0035; H05K 7/208; H05K 7/20745
See application file for complete search history.

(56) References Cited

U.S. PATENT DOCUMENTS 3,775,993 A * 12/1973 Murphy ............... F28D 5/02
                                                    62/95
3,887,666 A   6/1975 Heller et al.
3,923,935 A  12/1975 Cates
(Continued)

FOREIGN PATENT DOCUMENTS

WO    2007/143798 A1    12/2007
WO    2014/165811 A1    10/2014

OTHER PUBLICATIONS

Dunnavant, Keith; "Indirect Air-Side Economizer Cycle Data Center Heat Rejection"; ASHARE Journal, Mar. 2011, pp. 44-54.
(Continued)

*Primary Examiner* — Tho V Duong
(74) *Attorney, Agent, or Firm* — Venable LLP

(57) ABSTRACT

A heat exchanger assembly, an indirect evaporative heat exchanger including the heat exchanger, and methods of operating the same. The heat exchanger assembly includes at least one tube, a plurality of sections, and a plurality of nozzles. The at least one tube is configured to (i) have a process fluid flow therethrough in a first direction and (ii) have a scavenger cooling medium flow over the outer surface of the tube in a second direction. The second direction intersects the first direction. The plurality of sections is aligned in the first direction. The plurality of nozzles are located above the at least one tube. At least one nozzle of the plurality of nozzles is (i) located in each of the plurality of sections and (ii) configured to selectively discharge coolant onto the portion of the tube in that section of the heat exchanger.

12 Claims, 4 Drawing Sheets

(56) References Cited

U.S. PATENT DOCUMENTS

| | | |
|---|---|---|
| 3,925,523 A | 12/1975 | Cates |
| 4,002,040 A | 1/1977 | Munters et al. |
| 4,076,771 A | 2/1978 | Houx, Jr. et al. |
| 4,112,027 A | 9/1978 | Cates |
| 4,380,910 A | 4/1983 | Hood et al. |
| 4,683,101 A | 7/1987 | Cates |
| 4,708,832 A | 11/1987 | Norback |
| 4,893,669 A | 1/1990 | Kashiwada et al. |
| 5,193,352 A | 3/1993 | Smith et al. |
| 5,390,502 A | 2/1995 | Storbeck et al. |
| 5,390,505 A | 2/1995 | Smith et al. |
| 5,401,419 A | 3/1995 | Kocib |
| 5,411,078 A | 5/1995 | Ares |
| 5,435,382 A | 7/1995 | Carter |
| 5,695,117 A | 12/1997 | Sizemore et al. |
| 5,724,828 A * | 3/1998 | Korenic .................... F28C 1/14 62/305 |
| 6,142,219 A | 11/2000 | Korenic et al. |
| 6,213,200 B1 | 4/2001 | Carter et al. |
| 6,385,987 B2 * | 5/2002 | Schlom .................... F28C 1/14 62/304 |
| 6,564,864 B2 | 5/2003 | Carter et al. |
| 6,574,975 B2 | 6/2003 | Bourne et al. |
| 6,640,575 B2 | 11/2003 | Word |
| 6,748,759 B2 | 6/2004 | Wu |
| 7,128,138 B2 | 10/2006 | Des Champs |
| 7,243,909 B2 | 7/2007 | Koplin |
| 7,364,141 B2 | 4/2008 | Brenneke et al. |
| 7,716,829 B2 | 5/2010 | Des Champs |
| 7,765,827 B2 | 8/2010 | Schlom et al. |
| 8,434,746 B2 | 5/2013 | Carter et al. |
| 8,676,385 B2 * | 3/2014 | Myers .................... F28F 27/003 165/279 |
| 8,966,924 B2 | 3/2015 | Pichai |
| 9,021,821 B2 | 5/2015 | Dunnavant |
| 9,032,742 B2 | 5/2015 | Dunnavant |
| 9,055,696 B2 | 6/2015 | Dunnavant |
| 9,243,847 B2 | 1/2016 | Benz et al. |
| 9,255,739 B2 | 2/2016 | Aaron et al. |
| 9,278,303 B1 | 3/2016 | Somani et al. |
| 9,279,619 B2 | 3/2016 | Aaron et al. |
| 9,291,397 B2 | 3/2016 | Dalton et al. |
| 9,313,929 B1 | 4/2016 | Malone et al. |
| RE46,343 E | 3/2017 | Des Champs |
| 9,591,792 B2 | 3/2017 | Carlson |
| 9,791,903 B2 | 10/2017 | Hay |
| 10,619,953 B2 * | 4/2020 | Blay .................... F24F 13/16 |
| 2007/0101746 A1 * | 5/2007 | Schlom .................... F24F 5/0007 62/310 |
| 2011/0023506 A1 | 2/2011 | Day et al. |
| 2012/0167610 A1 | 7/2012 | Dunnavant |
| 2013/0269924 A1 | 10/2013 | Bugler et al. |
| 2014/0202151 A1 * | 7/2014 | Bharathan .................... F28B 1/06 60/641.2 |
| 2014/0262163 A1 | 9/2014 | Des Champs |
| 2016/0069577 A1 | 3/2016 | Dinnage |
| 2017/0074553 A1 | 3/2017 | Dinnage |
| 2019/0145721 A1 * | 5/2019 | Blay .................... F28D 7/087 165/227 |

OTHER PUBLICATIONS

Munters Corporation, Data Center Division, "Energy Efficient Cooling Technology."

Munters Corporation; Oasis IEC Indirect Evaporative Cooler; http://www.munters.com/en/munters/products/coolers--humidifiers/oasis-indirect-evaporative-coolers-iec/.

2012 ASHRAE Handbook—HVAC Systems and Equipment; pp. 41.1-41.13.

WayBack Machine; "Indirect Evaporative Cooling Units", Aug. 16, 2010, capture of https://www.energylabs.com/web2/ind.html.

TRACE 700 User's Manual, "Direct and indirect evaporative cooling", pp. 4-40-4-49.

* cited by examiner

US 11,022,374 B2

STAGED SPRAY INDIRECT EVAPORATIVE COOLING SYSTEM

FIELD OF THE INVENTION

This invention relates to cooling systems and systems and methods to control them. In particular, this invention relates to air stream cooling systems using indirect evaporative cooling. A particularly suitable application, for example, is in data center cooling systems.

BACKGROUND OF THE INVENTION

Servers in data centers generate a large amount a heat, requiring cooling. One cooling system used for data centers is an indirect evaporative cooling system, such as the Oasis™ indirect evaporative cooling system produced by Munters Corporation of Buena Vista, Va. The Oasis™ system includes a polymer air-to-air crossflow tube heat exchanger. In this system, process air flows through the inside of the tubes as scavenger air flows over the outside of the tubes. The process air is cooled by transferring its heat to the scavenger air. On cold and cool days, the polymer tube heat exchanger operates dry, as an air-to-air heat exchanger. Scavenger air indirectly cools the data center air through normal heat exchange, without the use of any water. Once the ambient temperature rises to a certain point, water is pumped from sumps to spray nozzles that wet the outside surface of the polymer tubes, coating them with a thin film of water. The scavenger air evaporates water on the exterior of the tubes, which causes heat to be extracted from the recirculating data center air flowing internal to the tubes. The nozzles of this system are arranged and configured to wet the full length of the tubes of the polymer heat exchanger when water is sprayed from the nozzles.

Although the Oasis™ system provides a number of benefits, including reduced water consumption compared to other cooling systems, an even further reduction in water consumption is desired. The inventions described herein provide such a reduction in water consumption, as well as providing additional benefits in cold weather conditions and emergency backup systems.

SUMMARY OF THE INVENTION

In one aspect, the present invention relates to an indirect evaporative heat exchanger. The indirect evaporative heat exchanger includes a heat exchanger assembly, a plurality of nozzles, a sump, at least one pump, a temperature sensor, and a controller. The heat exchanger assembly includes at least one tube having a first end, a second end, and an outer surface. The at least one tube is configured to (i) have a process fluid flow therethrough in a first direction from the first end to the second end and (ii) have a scavenger cooling medium flow over the outer surface of the tube in a second direction. The second direction intersects the first direction. The heat exchanger assembly also includes a plurality of sections aligned in the first direction. Each section of the plurality of sections includes a portion of the at least one tube. The plurality of nozzles are located above the at least one tube. At least one nozzle of the plurality of nozzles is (i) located in each of the plurality of sections and (ii) configured to selectively discharge coolant onto the portion of the tube in that section of the heat exchanger. The sump is located beneath the at least one tube. The sump is configured to collect the coolant discharged from the plurality of nozzles after the coolant flows over the tube. The at least one pump is configured to circulate water from the sump to the nozzles located in at least one section of the heat exchanger. The temperature sensor is configured to detect a control temperature. The controller communicatively coupled to the temperature sensor and configured to (i) receive a signal from the temperature sensor indicating the temperature detected by the temperature sensor, and operate, when the temperature detected by the temperature sensor is less than a predetermined threshold, the pump to circulate coolant from the sump to the nozzles located in one section of the heat exchanger to prevent freezing of the coolant in the sump.

In another aspect, the invention relates to a method of preventing freezing in a sump of an evaporative heat exchanger. The evaporative heat exchanger includes a heat exchanger assembly. The heat exchanger assembly has at least one tube having a first end, a second end, and an outer surface. The at least one tube is configured to (i) have a process fluid flow therethrough in a first direction from the first end to the second end and (ii) have a scavenger cooling medium flow over the outer surface of the tube in a second direction. The second direction intersects the first direction. The heat exchanger assembly also includes a plurality of sections aligned in the first direction. Each section of the plurality of sections includes a portion of the at least one tube. The method includes identifying that a control temperature is less than a predetermined threshold, circulating a coolant from the sump to at least one nozzle located in one section of the heat exchanger, discharging the circulated coolant from the at least one nozzle onto the portion of the tube in the section of the heat exchanger in which the nozzle is located, and collecting in the sump the coolant discharged from the at least one nozzle after the coolant flows over the tube.

In a further aspect, the invention relates to a cooling system. The cooling system includes an indirect evaporative heat exchanger configured to cool a process fluid, a mechanical cooling system, and a controller. The indirect evaporative heat exchanger includes at least one tube, a plurality of sections, and a plurality of nozzles. The at least one tube has a first end, a second end, and an outer surface. The at least one tube is configured to (i) have the process fluid flow therethrough in a first direction from the first end to the second end and (ii) have a scavenger cooling medium flow over the outer surface of the tube in a second direction. The second direction intersects the first direction. The plurality of sections are aligned in the first direction. Each section of the plurality of sections includes a portion of the at least one tube. The plurality of nozzles are located above the at least one tube. At least one nozzle of the plurality of nozzles is (i) located in each of the plurality of sections and (ii) configured to selectively discharge water onto the portion of the tube in that section of the indirect evaporative heat exchanger. The mechanical cooling system includes evaporator coils configured to (i) have the process fluid flow therethrough and (ii) cool the process fluid. The controller has a water loss mode corresponding to a loss of water supply event. The controller is configured to, in the water loss mode, selectively discharge water from the nozzles located in one section of the indirect evaporative heat exchanger to cool the process fluid, and operate the mechanical cooling system to cool the process fluid.

In still another aspect, the invention relates to a method of operating a cooling system during a loss of water supply event. The method includes identifying that a water supply to the cooling system from a normal water supply line has been interrupted and cooling a process fluid with an indirect evaporative heat exchanger. The indirect evaporative heat exchanger includes at least one tube, a plurality of sections, and a plurality of nozzles. The least one tube has a first end, a second end, and an outer surface. The at least one tube is configured to (i) have the process fluid flow therethrough in a first direction from the first end to the second end and (ii) have a scavenger cooling medium flow over the outer surface of the tube in a second direction. The second direction intersects the first direction. The plurality of sections are aligned in the first direction. Each section of the plurality of sections includes a portion the at least one tube. The plurality of nozzles are located above the at least one tube. At least one nozzle of the plurality of nozzles is located in each of the plurality of sections. The process fluid is cooled by selectively discharging water from the nozzles located in one section of the indirect evaporative heat exchanger. The method further includes operating the mechanical cooling system to cool the process fluid. The mechanical cooling system includes evaporator coils configured to have the process fluid flow therethrough.

In yet another aspect, the invention relates to an indirect evaporative heat exchanger. Indirect evaporative heat exchanger includes a heat exchanger assembly and a plurality of nozzles. The heat exchanger assembly includes a plurality of linear tubes. Each of the tubes having a first end, a second end and an outer surface. Each of the tubes is configured to (i) have a process fluid flow therethrough in a first direction from the first end to the second end and (ii) have a scavenger cooling medium flow over the outer surface of each tube in a second direction. The second direction intersects the first direction. The heat exchanger assembly also includes a plurality of sections aligned in the first direction. Each section of the plurality of sections including a portion of each of the plurality of tubes. The plurality of nozzles are located above the plurality of linear tubes. At least one nozzle of the plurality of nozzles is (i) located in each of the plurality of sections and (ii) configured to selectively discharge coolant onto the portion of each of the plurality of tubes in that section of the heat exchanger.

In still a further aspect, the invention relates to a method cooling a process fluid in an indirect evaporative heat exchanger. The method includes flowing a process fluid through a plurality of linear tubes of a heat exchanger assembly in a first direction from a first end of each of the tubes to a second end of each of the tubes. The heat exchanger assembly has a plurality of sections, and a portion of each of the plurality of tubes is included in each section of the plurality of sections of the heat exchanger assembly. The method also includes flowing a scavenger cooling medium over an outer surface of each tube in a second direction to cool the process fluid. The second direction intersects the first direction. The method further includes selecting at least one nozzle of a plurality of selectable nozzles, when the scavenger cooling medium flow alone is not sufficient to cool the process fluid to a target temperature. At least one nozzle of the plurality of selectable nozzles is located in each one of the plurality of sections of the heat exchanger assembly. The method still further includes discharging a coolant from the nozzles selected in the selecting step onto the portion of the tubes in the corresponding section of the indirect heat exchanger assembly to further cool the process fluid.

These and other aspects, objects, features, and advantages of the invention will become apparent from the following detailed description of illustrative embodiments thereof, which is to be read in connection with the accompanying drawings.

DETAILED DESCRIPTION OF THE PREFERRED EMBODIMENTS

Figure 1:
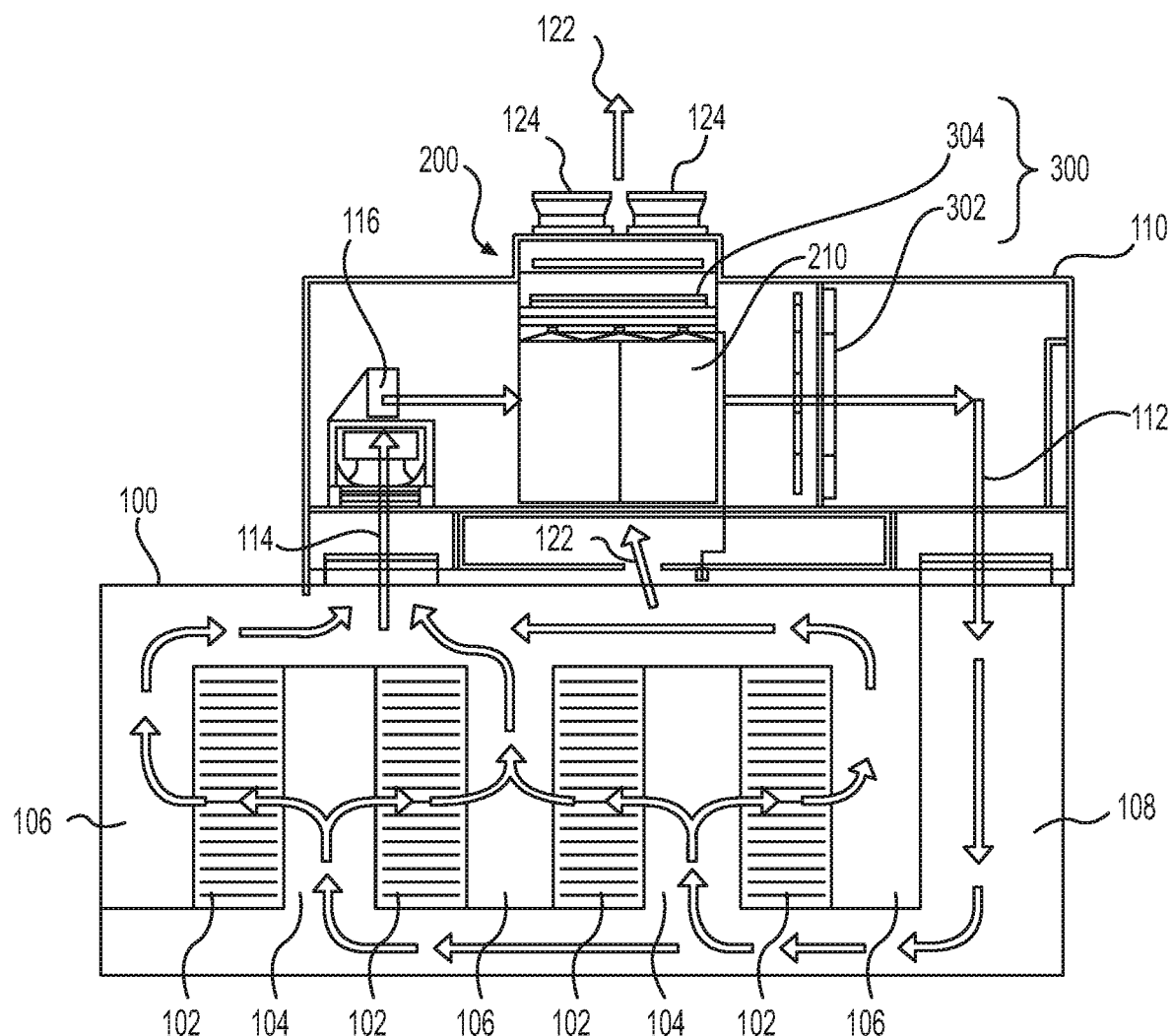
FIG. 1 is an elevation view of a data center using a cooling system according to a preferred embodiment of the invention.

FIG. 1 shows a data center 100 having a cooling system 110 according to a preferred embodiment of the invention. Although the cooling system 110 is shown and described in reference to a data center 100, the cooling system 110 is not limited to this application and may be used in other suitable air cooling applications. Electronic components such as servers may be mounted on racks 102, and in a data center 100, these racks 102 may be arranged in rows forming aisles 104, 106, therebetween. One aisle 104 is a cold aisle, and another aisle 106 is a hot aisle. Cool, supply air 112 from the cooling system 110 is directed into the cold aisle 104, using, for example, ducts 108. The supply air 112 then passes from the cold aisle 104 through the racks and into the hot aisle 106. As the air passes through the racks 102, it draws heat from the electronic components, resulting in hot air passing into the hot aisle 106. This air is then directed back to the cooling system 110 as hot, return air 114. Supply air fans 116 are used to draw the return air 114 from the data center 100, pass the return air 114 through the cooling system 110, where it is cooled, and then return the now cooled return air 114 to the data center 100 as supply air 112.

Figure 2:
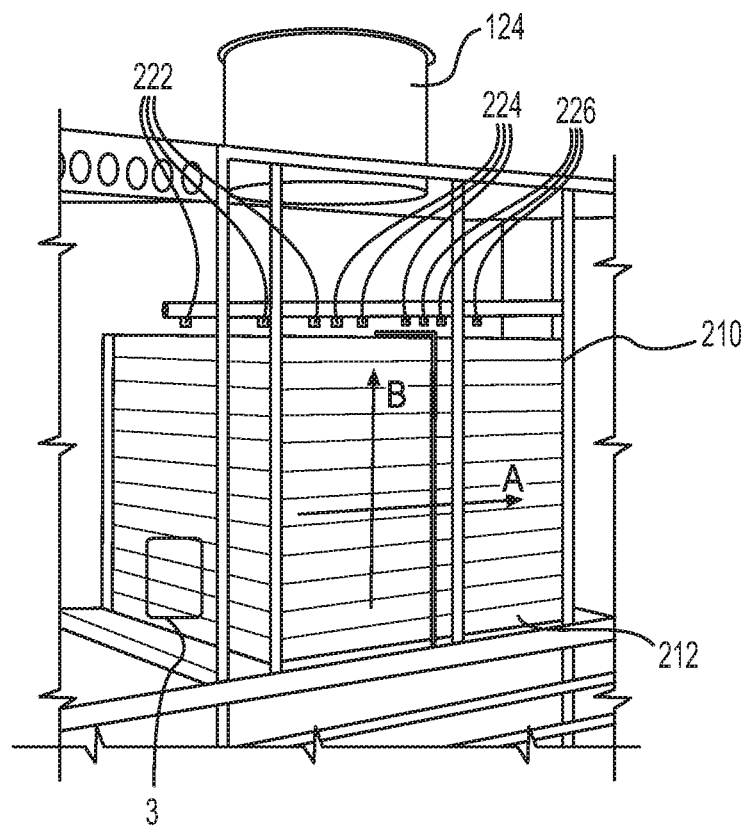
FIG. 2 is a perspective view of the indirect heat exchanger of the cooling system shown in FIG. 1.
Figure 3:
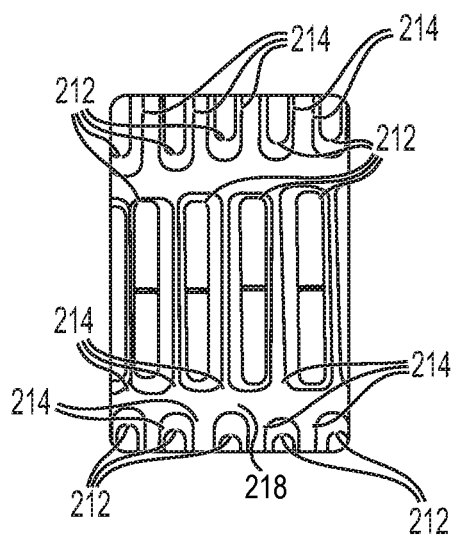
FIG. 3 is a detail view of the indirect heat exchanger shown in FIG. 2 showing detail 3 of FIG. 2.

The cooling system 110 uses an indirect heat exchanger 200 to cool the return air 114. FIG. 2 is a perspective view of the indirect heat exchanger 200 and FIG. 3 is a detail view showing detail 3 of FIG. 2. The indirect heat exchanger 200 includes a heat exchanger assembly 210 having a plurality of tubes 212. Although any suitable geometry may be used, in this embodiment, each of the tubes 212 is generally rectangular with rounded ends (see FIG. 3). The tubes 212 are oriented in a vertical direction such that the long dimension of the generally rectangular tubes 212 is vertical. The tubes 212 are arrayed horizontally in rows with a gap 214 between adjacent tubes 212. The tubes 212 are also arrayed vertically. In the vertical direction, each row is staggered from the one above or below it. In this embodiment, the centerline of the tubes 212 in one row is aligned with the center of the gap 214 between tubes 212 in the rows above and below. Any suitable array, however, may be used including, for example, aligning the tubes 212 in the vertical direction instead of staggering them. The tubes 212 are supported at each end by a header plate 218.

Figure 4:
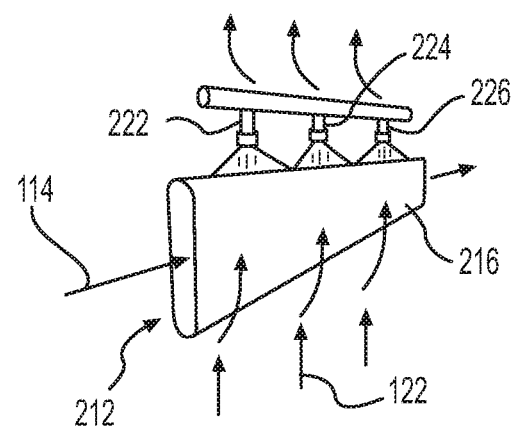
FIG. 4 is shows a tube of the indirect heat exchanger shown in FIG. 2.

The return air 114 is directed through the tubes 212 by the supply air fans 116. The tubes 212 of this embodiment are linear and extend in a first direction A, which in this embodiment is a horizontal direction, and thus the return air 114 travels through the tubes 212 in the first direction A as a process fluid. The return air 114 is indirectly cooled as is travels through the tubes 212 by scavenger air 122 (see FIG. 4). The scavenger air 122 is drawn over an outer surface 216 of each of the tubes 212 (see FIG. 4) by scavenger fans 124 (see also FIG. 1). In this embodiment, the scavenger air 122 is ambient air drawn from the outdoor environment surrounding the cooling system 110. Also in this embodiment, the indirect heat exchanger 200 is a cross flow heat exchanger. The scavenger air 122 is drawn over the outer surface 216 of each of the tubes 212 in a second direction B that intersects the first direction A. In this embodiment, the second direction B is perpendicular to the first direction A. When the ambient temperature is cool enough, the indirect heat exchanger operates dry, as an air-to-air heat exchanger. When the ambient temperature rises, however, water may be discharged from a plurality of nozzles 220 located above the heat exchanger assembly 210. As shown in FIG. 4, the water flows down around the exterior (outer surface 216) of each of the tubes 212. With the scavenger air 122 flowing over the outer surface 216 of each of the tubes 212, evaporative heat transfer efficiently cools the return air 114 flowing though the interior of the tubes 212. The header plates 218 separate the scavenger air 122 from return air 114 and supply air 112.

Figure 5:
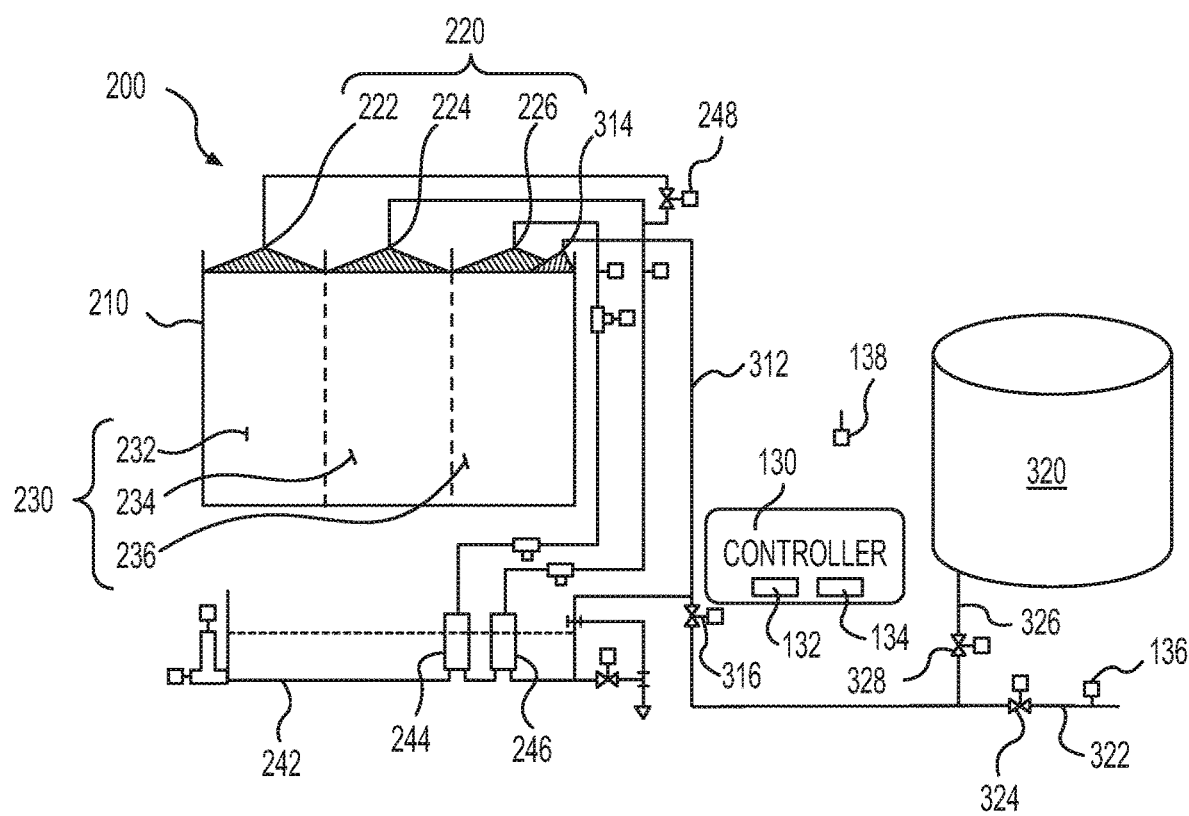
FIG. 5 is a schematic of the indirect heat exchanger of the cooling system shown in FIG. 1.

As shown in FIG. 5, the indirect heat exchanger 200 of this embodiment is divided into a plurality of sections 230 along the first direction A. Although any suitable number of sections 230 may be used, the indirect heat exchanger 200 of this embodiment has three sections 230. Also, in this embodiment, the sections 230 are evenly distributed over the length of the tubes 212 with each section including a third of each of the plurality of tubes 212, although other suitable distributions may be used. A first section 232 is the first third of the tubes 212 proximate the end of each of the tubes 212 where the return air 114 enters the tubes 212. The third section 236, which may also be referred to as an end section, is the last third of the tubes 212 is proximate the exit of the tubes 212. And, the second section 234 is the middle third between the first section 232 and the third section 236.

In this embodiment, the indirect heat exchanger 200 is physically separated into three sections by two partitions 238, together with the header plates 218. The partitions 238 are similar to the header plates 218. The partitions 238, like the header plates 218, are plates through which the tubes 212 extend, and in this embodiment, the partitions 238 extend the full height and width of the heat exchange assembly 210. The partitions 238 provide structural support for the tubes 212, particularly in embodiments where the tubes 212 are long. Further, when water is discharged in less than all of the sections (as will be discussed further below), the partitions 238 act as a barrier helping to contain the discharged water in the particular section(s) 230 of the heat exchanger assembly 210 being wetted.

Figure 6:
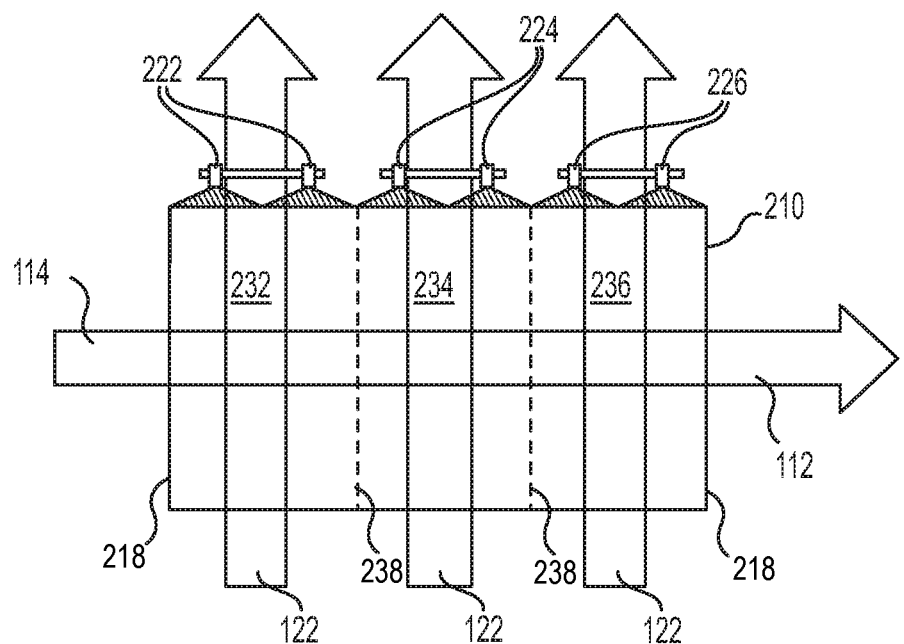
FIG. 6 is a schematic of the indirect heat exchanger of the cooling system shown in FIG. 1 showing an alternate configuration of nozzles.

In this embodiment, there are three nozzles 220 that are used to distribute water over the length of each of the tubes 212. A first nozzle 222 is located in the first section 232 and used to distribute water over the portion of the tubes 212 in the first section 232. A second nozzle 224 is located in the second section 234 and used to distribute water over the portion of the tubes 212 in the second section 234. And, a third nozzle 226 is located in the third section 236 and used to distribute water over the portion of the tubes 212 in the third section 236. A plurality of nozzles 220 may be used in each section instead of a single nozzle, and thus the first, second, and third nozzles 222, 224, 226, may be first, second, and third nozzle sets, respectively. A plurality of nozzles may be used in each section 230, for example, to ensure that the entire width of the rows in the heat exchanger assembly 210 are wetted when water is discharged from nozzles 220 in a section 230 of the indirect heat exchanger 200, as can be seen in FIG. 2. A plurality of nozzles may also be used in each section 230, for example, to ensure that the entire portion of each of the tubes 212 in that section of the heat exchanger assembly 210 is wetted when water is discharged from nozzles 220 in a section 230. FIG. 6 shows a schematic of the indirect heat exchanger 200 with a plurality of nozzles 220 in each section 230.

With the indirect heat exchanger 200 divided into a plurality of sections 230, the indirect heat exchanger 200 can be wetted in stages, instead of operating with the entire length of each tube 212 being either dry or wetted. Staging allows the return air 114 to first be cooled in one or more dry sections 230, before water is used in the remaining sections 230, downstream from the dry sections, to achieve the target temperature of the supply air 112. As discussed above, the indirect heat exchanger 200 operates dry, as an air-to-air heat exchanger, when the ambient temperature is cool enough. When scavenger air 122 alone is not sufficient to cool the return air 114 to the target temperature for the supply air 112, water may be discharged from the nozzles 220 in at least one section 230 of indirect heat exchanger 200.

Figure 7:
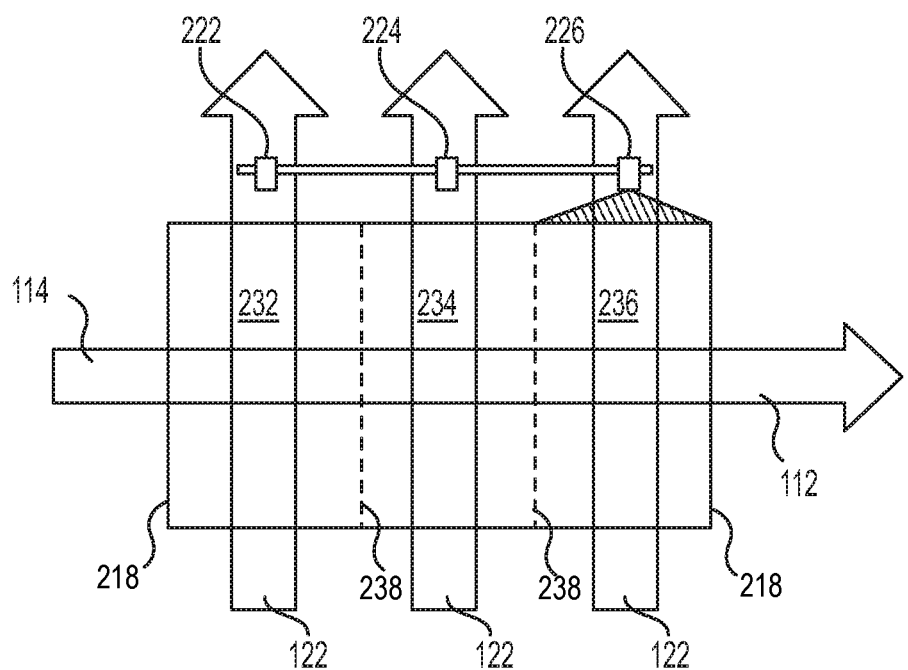
FIG. 7 is a schematic of the indirect heat exchanger shown in FIG. 3 showing a first stage operating.

As shown in FIG. 7, for example, water is discharged from the nozzles 226 in the third section 236 of the indirect heat exchanger 200. The return air 114 is thus first cooled by the scavenger air 122 alone in the first section 232 and the second section 234 before water is used achieve enhanced heat exchange provided by indirect evaporative cooling ("IEC") in the third section 236. When discharging water from the nozzles 220 in only one section 230 of the indirect heat exchanger 200 is not sufficient to cool the return air 114 to the target temperature for the supply air 112, water may be discharged from the nozzles 220 in additional sections 230. For example, water may be discharged from the nozzles 224, 226 in the second and third sections 234, 236, while the first section 232 is operated dry. Thus additional sections 230 may be activated until water is discharged from the nozzles 220 in all of the sections 230 of the indirect heat exchanger 200. Staging of the indirect heat exchanger 200 has advantages of better temperature control when transitioning from the 100% dry heat exchange mode to the IEC mode and reduced water consumption, as compared to an indirect heat exchanger without staging.

The cooling system 110 includes a controller 130 for operating the cooling system 110 including the indirect heat exchanger 200, as shown in FIG. 5. In this embodiment, the controller 130 is a microprocessor-based controller that includes a processor 132 for performing various functions discussed further below and a memory 134 for storing various data. The controller 130 may also be referred to as a CPU. In one embodiment, control of the cooling system 110 may be implemented by way of a series of instructions stored in the memory 134 and executed by the processor 132. The controller 130 is thus communicatively coupled to the various pumps and valves in the system, such that they can be operated as discussed further below. In addition, the controller 130 may also be communicatively coupled to input devices and display devices, as necessary.

FIG. 5 is a schematic of the indirect heat exchanger 200. As water is discharged from the nozzles 220, the water flows over the tubes 212 of the heat exchanger assembly 210, and the portion of the water not evaporated during the cooling process is collected in a sump 242. At least one pump 244, 246 is used to circulate the water from the sump 242 to the nozzles 220. In the indirect heat exchanger 200 shown in FIG. 5, a first pump 244 is fluidly connected to the nozzles 226 in the third section 236. A second pump 246 is fluidly connected to the nozzles 222, 224 in each of the first and second sections 232, 234. A staging valve 248 is located between the second pump 246 and the nozzles 222 of the first section 232. When operating in the first stage of the IEC mode, the controller 130 may operate the first pump 244 to circulate water from the sump 242 and discharge water from the nozzles 226 in the third section 236. In the first stage, the controller 130 does not operate the second pump 246. In the second stage, the staging valve 248 is closed to isolate the nozzles 222 of the first section 232 from the second pump 246, and both the first and second pumps 244, 246 are operated to discharge water from the nozzles 224, 226 in the second and third sections 234, 236. The third stage is similar to the second stage, but the staging valve 248 is open to also discharge water from the nozzles 222 in the first section 232. Although described with two pumps 244, 246 and a single staging valve 248, any suitable number of pumps and staging valves may be used in various combinations to achieve the desired staging of the indirect heat exchanger 200.

There are some additional benefits that may be available by incorporating a staged spray approach. In cooling applications, the indirect heat exchanger 200 is typically not able to satisfy the required cooling load at all operating conditions, so a supplemental mechanical cooling system 300 may also be included with the cooling system 110 (see FIG. 1). This mechanical cooling system 300 includes a cooling coil 302, located in the flow path of the return air 114. In the embodiment shown in FIG. 1, the cooling coil 302 is located downstream of the indirect heat exchanger 200 and is configured to cool the return air 114 after it has been cooled by the indirect heat exchanger 200. Any suitable mechanical cooling system may be used including systems that use direct expansion refrigerant or chilled water to cool the cooling coil 302.

In this embodiment, the mechanical cooling system 300 is a direct expansion (DX) cooling system 300 using the common refrigeration cycle. The direct expansion cooling system 300 includes a compressor (not shown) to increase the pressure and temperature of the refrigerant after the cooling coil 302 and before it is cooled in a condenser 304. In this embodiment, the condenser 304 of the direct expansion cooling system 300 is positioned above the indirect heat exchanger 200 and may also be cooled by the scavenger air 122. Other suitable configurations for the condenser 304 may be used including, for example, being located separately from the indirect heat exchanger 200 and in an airstream other than the scavenger air 122. The refrigerant then passes through an expansion valve (not shown), reducing its pressure and temperature, before returning to the cooling coil 302.

The mechanical cooling system 300 system is commonly referred to as a trim cooling system, as it is typically only sized to provide the balance of required cooling after the indirect evaporative cooling process of the indirect heat exchanger. In critical cooling applications, such as data center cooling, performance must be guaranteed. If the trim cooling system (mechanical cooling system 300) is only partially sized, water storage must be provided by the facility in order to maintain full cooling capacity in the case of a water loss event. Such storage may be provided by a water storage tank 320 (see FIG. 5). These storage tanks 320 are typically sized based on the peak water evaporation requirements for a continuous time interval such as 24 or 48 hours. Typical-year (TMY) hourly weather data is evaluated to determine the period of peak water use. The indirect heat exchanger 200 discussed herein enables a significant reduction in the size of these back-up water storage tanks 320.

As shown in FIG. 5, water is added to the indirect heat exchanger by a feed line 312. In this embodiment, water may be added to the indirect heat exchanger 200 by discharging water from a feed nozzle 314 located above the heat exchanger assembly 210. Water discharged from the feed nozzle 314 then flows over the tubes 212 and into the sump 242 in a manner similar to the nozzles 220 used for recirculation. A feed valve 316 may be opened and closed to control the addition of water from the feed line 312 to the indirect heat exchanger 200. Water may be added to the indirect heat exchanger 200 using other suitable configurations. For example, instead of filling the sump 242 by using the feed nozzle 314, the feed line 312 may directly empty into the sump 242.

The feed line 312 may be connected to various water supplies. One water supply may be the water supply used under normal operational conditions. The normal water supply may be any suitable water supply that the facility, in which the cooling system 110 is located, uses for water. Such normal water supplies may include water from a municipal water main, a well, or the like. As shown in FIG. 5, this normal water supply is connected to the feed line 312 by a normal water supply line 322. A normal water supply valve 324 is used to isolate the normal water supply line 322 from the feed line 312. As discussed above, water may also be supplied to the cooling system 110 by a backup water supply. The backup water supply may be stored in water storage tanks 320. The water storage tanks 320 are fluidly connected to the feed line 312 by a backup water supply line 326, and a backup water supply valve 328 is used to isolate the backup water supply line 326 (and water storage tanks 320) from the feed line 312.

In a loss of water supply event where the normal water supply being provided through the normal water supply line 322 is interrupted, the cooling system 110 may be operated in a water loss mode. In this embodiment, the water loss mode includes shifting the cooling burden to the mechanical cooling system 300 instead of the indirect heat exchanger 200. When the ambient temperature is not low enough to cool the return air 114 by scavenger air 122 alone, even with the scavenger air fans 124 operating to provide maximum air flow of the scavenger air 122, the mechanical cooling system 300 is operated up to its maximum capacity instead of discharging water from the nozzles 220 of the indirect heat exchanger 200. Then, if necessary, the indirect heat exchanger 200 may be operated with indirect evaporative cooling in only some of the sections 230 of the heat exchanger assembly 210. For example, the mechanical cooling system 300 may be sized such that the mechanical cooling system 300 and the indirect heat exchanger 200 operating in the first stage is sufficient to provide the needed cooling capacity based on the peak design conditions. As discussed above, water is discharged from the nozzles 226 in the third section 236 of the indirect heat exchanger 200 in the first stage. Operating the cooling system 110 in this way saves a significant amount of water during the water loss event, compared to operating the cooling system 110 with full water sprays, thereby reducing the required volume of water to be stored and the size of water storage tanks 320.

The water loss mode may be activated when it is identified that the normal water supply has been interrupted. The water loss mode may be activated manually when an operator identifies that the normal water supply has been interrupted, but the water loss mode may also be activated automatically.

As shown in FIG. 5, a water supply sensor 136 is located in the normal water supply line 322. The water supply sensor 136 is communicatively coupled to the controller 130, and when the water supply sensor 136 senses that the normal water supply has been interrupted, it sends a signal to the controller 130. Upon receiving the signal from the water supply sensor 136, the controller 130 activates the water loss mode. In the water loss mode, the normal water supply valve 324 is closed and the backup water supply valve 328 is opened to switch the water supply from the normal water supply to the backup water supply stored in the water storage tanks 320. The controller 130 then operates the cooling system 110 in the water loss mode as discussed above. The data center 100 may include a building management system (BMS) that controls various aspects of the data center 100 including the water supply to the cooling system 110. When the data center 100 is so equipped, the BMS may send a signal, and the controller 130 receives the signal, to operate the cooling system 110 in the water loss mode. Although the controller 130, in response to the signal received from the BMS, may operate the water supply valves 324, 328, the water supply valves 324, 328 may be operated though the BMS to activate (or deactivate) the water loss mode.

Incorporating a staged spray approach also provides a water savings benefit when the indirect heat exchanger 200 is operated in ambient temperatures near freezing. Because the indirect heat exchanger 200 is typically able to provide full cooling using only scavenger air 122 at temperatures well above freezing, the water system (including the sump 242) is usually drained as ambient temperatures approach freezing to eliminate any freeze concerns. In areas that frequently experience temperature drops towards freezing at night, but heat up and require indirect evaporative cooling during the day, this can lead to frequent fill and dump cycles for the sump 242 that waste water every time the sump 242 is drained. In applications with variable cooling load, a sump basin heater is often employed to allow the sump water to ride through the cold temperatures. This approach is acceptable, but requires energy to operate the heaters. However, in facilities that have a more consistent heat load, such as data centers 100, staged water sprays may provide a more efficient approach.

When the ambient temperature reaches a predetermined threshold, the indirect heat exchanger 200 is operated in the first stage. In the first stage, water is circulated from the sump 242 by the first pump 244 to the nozzles 222 in the first section 232. The water discharged from the nozzles 222 will extract enough heat from the return air to keep the entire sump 242 warm enough to prevent freezing. Alternatively, instead of measuring ambient temperatures and using a predetermined threshold based on ambient temperatures, temperature of the water in the sump 242 can be measured and the predetermined threshold is based on the temperature of the water in the sump 242.

Although the indirect heat exchanger 200 may be operated in the first stage to prevent freezing when an operator identifies that the temperature has dropped below the predetermined threshold, the indirect heat exchanger 200 may also automatically start this operation. As shown in FIG. 5, a temperature detector 138 is configured to measure the temperature of the ambient air or, alternatively the temperature of the water in the sump 242. The temperature detector 138 is communicatively coupled to the controller 130 and transmits the temperature of the ambient air (or water in the sump 242) to the controller 130. The controller 130 receives the temperature of the ambient air (or water in the sump 242) from the temperature detector 138, and when the controller 130 determines that the temperature has dropped below the predetermined threshold, the controller 130 operates the first stage of the indirect heat exchanger 200 to prevent freezing of the water in the sump 242 as discussed above.

Although this invention has been described in certain specific exemplary embodiments, many additional modifications and variations will be apparent to those skilled in the art in light of this disclosure. It is, therefore, to be understood that this invention may be practiced otherwise than as specifically described. Thus, the exemplary embodiments of the invention should be considered in all respects to be illustrative and not restrictive, and the scope of the invention to be determined by any claims supportable by this application and the equivalents thereof, rather than by the foregoing description.

What is claimed is:

1. An indirect evaporative heat exchanger comprising:
a heat exchanger assembly including:
at least one tube having a first end, a second end, and an outer surface, the at least one tube being configured to (i) have a process fluid flow therethrough in a first direction from the first end to the second end and (ii) have a scavenger cooling medium flow over the outer surface of the tube in a second direction, the second direction intersecting the first direction; and
a plurality of sections aligned in the first direction, each section of the plurality of sections including a portion of the at least one tube;
a plurality of nozzles located above the at least one tube, at least one nozzle of the plurality of nozzles being (i) located in each of the plurality of sections and (ii) configured to selectively discharge coolant onto the portion of the tube in that section of the heat exchanger;
a sump located beneath the at least one tube, the sump being configured to collect the coolant discharged from the plurality of nozzles after the coolant flows over the tube;
at least one pump configured to circulate water from the sump to the nozzles located in at least one section of the heat exchanger;
a temperature sensor configured to detect a control temperature; and
a controller communicatively coupled to the temperature sensor and configured to:
receive a signal from the temperature sensor indicating the temperature detected by the temperature sensor; and
operate, when the temperature detected by the temperature sensor is less than a predetermined threshold, the pump to circulate coolant from the sump to the nozzles located in one section of the heat exchanger to prevent freezing of the coolant in the sump.

2. The indirect evaporative heat exchanger of claim 1, wherein the control temperature is at least one of the temperature of ambient air and the temperature of the water in the sump.

3. The indirect evaporative heat exchanger of claim 1, wherein the plurality of sections includes three sections, a first section being proximate the first end of the tube, a third section being proximate the second end of the tube, and a second section between the first and third sections.

4. The indirect evaporative heat exchanger of claim 1, wherein the plurality of sections includes an end section, the end section being proximate the second end the tube, and
wherein the pump is fluidly connected to the nozzles in the end section and configured to circulate coolant from the sump to the nozzles located in the end section.

5. A method of preventing freezing in a sump of the evaporative heat exchanger of claim 1, the method comprising:
- identifying, via the controller, that the control temperature is less than the predetermined threshold;
- operating, via the controller, the pump to circulate coolant from the sump to the nozzles located in one section of the heat exchanger;
- discharging the circulated coolant from the at least one nozzle onto the portion of the tube in the section of the heat exchanger in which the nozzle is located; and
- collecting in the sump the coolant discharged from the at least one nozzle after the coolant flows over the tube.

6. A cooling system comprising:
- an indirect evaporative heat exchanger configured to cool a process fluid, the indirect evaporative heat exchanger including:
  - at least one tube having a first end, a second end, and an outer surface, the at least one tube being configured to (i) have the process fluid flow therethrough in a first direction from the first end to the second end and (ii) have a scavenger cooling medium flow over the outer surface of the tube in a second direction, the second direction intersecting the first direction;
  - a plurality of sections aligned in the first direction, each section of the plurality of sections including a portion of the at least one tube; and
- a plurality of nozzles located above the at least one tube, at least one nozzle of the plurality of nozzles being (i) located in each of the plurality of sections and (ii) configured to selectively discharge water onto the portion of the tube in that section of the indirect evaporative heat exchanger;
- a mechanical cooling system including evaporator coils configured to (i) have the process fluid flow therethrough and (ii) cool the process fluid; and
- a controller having a water loss mode corresponding to a loss of water supply event, the controller being configured to, in the water loss mode:
  - selectively discharge water from the nozzles located in one section of the indirect evaporative heat exchanger to cool the process fluid; and
  - operate the mechanical cooling system to cool the process fluid.

7. The cooling system of claim 6, further comprising a normal water supply line configured to supply water to the indirect evaporative heat exchanger in a normal operating mode, wherein the controller is further configured to:
- receive a signal indicating that the water supply from the normal water supply line has been interrupted; and
- operate, in response to the received signal, the cooling system in the water loss mode.

8. The cooling system of claim 6, further comprising a backup water supply line configured to supply water to the indirect evaporative heat exchanger in the water loss mode.

9. The cooling system of claim 8, further comprising a backup water supply tank fluidly coupled to the backup water supply line to supply water to the indirect evaporative heat exchanger.

10. The cooling system of claim 6, wherein the plurality of sections includes three sections, a first section being proximate the first end of the tube, a third section being proximate the second end of the tube, and a second section between the first and third sections.

11. The cooling system of claim 6, wherein the plurality of sections includes an end section, the end section being proximate the second end the tube, and
- wherein, in the water loss mode, the controller is configured to selectively discharge water from the nozzles located in the end section.

12. A method of operating the cooling system of claim 6 during a loss of water supply event, the method comprising:
- identifying that a water supply to the cooling system from a normal water supply line has been interrupted; and
- cooling a process fluid with the indirect evaporative heat exchanger operating in the water loss mode by selectively discharging water from the nozzles located in one section of the indirect evaporative heat exchanger and operating a mechanical cooling system to cool the process fluid.

* * * * *